United States Patent
Catania et al.

(10) Patent No.: US 12,417,953 B2
(45) Date of Patent: Sep. 16, 2025

(54) CONNECTOR

(71) Applicant: STMICROELECTRONICS (GRENOBLE 2) SAS, Grenoble (FR)

(72) Inventors: Justin Catania, Grenoble (FR); Michel Garnier, Bellecombe-en-Bauges (FR); Fabien Quercia, Saint Marcelin (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 424 days.

(21) Appl. No.: 17/885,201

(22) Filed: Aug. 10, 2022

(65) Prior Publication Data

US 2023/0059627 A1   Feb. 23, 2023

(30) Foreign Application Priority Data

Aug. 17, 2021 (FR) ........................................ 2108732

(51) Int. Cl.
*H01L 23/13* (2006.01)
*H01L 23/00* (2006.01)
(Continued)

(52) U.S. Cl.
CPC ........ *H01L 23/13* (2013.01); *H01L 23/49838* (2013.01); *H05K 3/308* (2013.01); *H05K 3/34* (2013.01); *H01L 24/13* (2013.01); *H01L 24/16* (2013.01); *H01L 24/73* (2013.01); *H01L 2224/16105* (2013.01); *H05K 3/341* (2013.01); *H05K 3/4007* (2013.01); *H05K 2201/10189* (2013.01); *H05K 2201/10621* (2013.01); *H05K 2203/041* (2013.01)

(58) Field of Classification Search
CPC ... H01L 23/49838; H01L 24/13; H01L 24/16; H01L 24/73; H01L 2224/16105; H05K 3/34; H05K 3/341; H05K 3/4007
See application file for complete search history.

(56) References Cited

U.S. PATENT DOCUMENTS 5,897,335 A * 4/1999 Wyland .................. H01L 24/81
                                                      257/E21.511
5,963,793 A * 10/1999 Rinne ................. H01L 25/0657
                                                      257/E23.021
(Continued)

FOREIGN PATENT DOCUMENTS

DE    102018108616 A1   10/2019
EP       0642163 A1      3/1995
(Continued)

*Primary Examiner* — David A Zarneke
(74) *Attorney, Agent, or Firm* — Seed IP Law Group LLP

(57) ABSTRACT

The present disclosure relates to an electronic device comprising a wafer comprising a first upper surface having at least one first contact arranged thereon; and at least one die comprising a second upper surface having at least one second contact arranged thereon, and at least one first lateral surface orthogonal to the second upper surface, said first contact being coupled to said second contact by a connector comprising one first conductive pillar formed on said first contact of said wafer; one second conductive pillar formed on said second contact of said die; and at least one conductive ball positioned in contact with at least a first upper portion of said first pillar(s) and in contact with at least one second upper portion of said second pillar(s).

20 Claims, 2 Drawing Sheets

(51) Int. Cl.
*H01L 23/498* (2006.01)
*H05K 3/30* (2006.01)
*H05K 3/34* (2006.01)
*H05K 3/40* (2006.01)

(56) References Cited

U.S. PATENT DOCUMENTS

2005/0189640 A1 9/2005 Grundy et al.
2019/0041211 A1 2/2019 Morinaka et al.

FOREIGN PATENT DOCUMENTS

JP 2013164279 A 8/2013
KR 2011-0124094 A 11/2011

* cited by examiner

CONNECTOR

BACKGROUND

Technical Field

The present disclosure generally concerns electronic systems and devices, as well as their manufacturing methods. More particularly, the present disclosure concerns the electric connection of internal elements of electronic systems and devices, such as electronic components, electronic dies, substrate plates, printed circuit boards, etc.

Description of the Related Art

A part of electronic systems and devices comprise one or a plurality of dies and/or one or a plurality of electronic components assembled on a plate, for example, a substrate plate or a printed circuit board. The electric connections between the different components may be achieved by multiple methods.

It would be desirable to be able to at least partly improve all or part of the disadvantages of the connectors used in electronic systems and devices.

BRIEF SUMMARY

There is a need for connectors used in electronic systems and devices adapted to connecting contacts arranged on surfaces orthogonal to one another of different elements of an electronic device.

There is a need for methods of manufacturing electronic systems or devices enabling to connect a lateral surface of a component or of a die to an upper surface of a plate.

An embodiment overcomes all or part of the disadvantages of known connectors.

An embodiment overcomes all or part of the disadvantages of known electronic device manufacturing methods.

One embodiment provides an electronic device comprising:
  a wafer comprising a first upper surface having at least one first contact arranged thereon; and
  at least one die comprising a second upper surface having at least one second contact arranged thereon, and at least one first lateral surface orthogonal to the second upper surface, the first lateral surface of said die being bonded to said first upper surface of said wafer,
  said first contact being electrically coupled to said second contact by a connector comprising:
    one or a stack of a plurality of first electrically-conductive pillars formed on said first contact of said wafer;
    one or a stack of a plurality of second electrically-conductive pillars formed on said second contact of said die; and
    at least one electrically-conductive ball positioned in contact with at least a first upper portion of said first pillar(s) and in contact with at least one second upper portion of said second pillar(s).

Another embodiment concerns a method of manufacturing an electronic device comprising the following successive steps:
  a) forming one or a stack of first electrically-conductive pillars on a first contact formed on a first upper surface of a wafer;
  b) forming one or a stack of second electrically-conductive pillars on a second contact formed on a second upper surface of a die;
  c) bonding a first lateral surface of said die to the first upper surface of said wafer, said first lateral surface being orthogonal to the second upper surface of said die;
  (d) forming and arranging an electrically-conductive ball in contact with a first upper portion of said first pillar(s) and in contact with a second upper portion of said second pillar(s).

According to an embodiment, said first pillar(s) are formed by using a tool adapted to a wireless solder technique.

According to an embodiment, said second pillar(s) are formed by using a tool adapted to the wireless solder technique.

According to an embodiment, said first pillar(s) are made of a metal or of a metal alloy.

According to an embodiment, said first pillar(s) are made of copper or of a metal alloy comprising copper.

According to an embodiment, said second pillar(s) are made of a metal or of a metal alloy.

According to an embodiment, said second pillar(s) are made of copper or of a metal alloy comprising copper.

According to an embodiment, said ball is made of a metal or of a metal alloy.

According to an embodiment, said ball is a soldering paste ball.

According to an embodiment, the first lateral surface of said die is bonded to the first upper surface of said wafer by gluing.

According to an embodiment, said die is an edge emitting laser die.

According to an embodiment, said wafer is a substrate.

According to an embodiment, said wafer is a printed circuit board.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
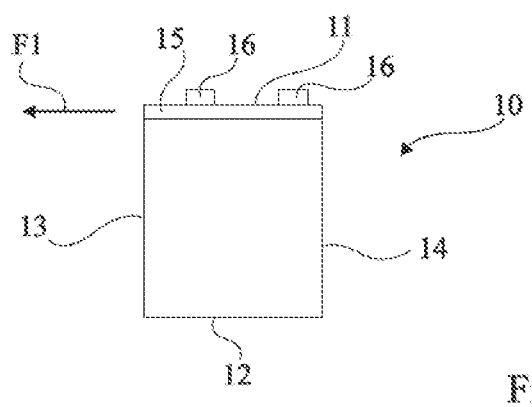
FIG. 1 shows a side view of a die.
Figure 2:
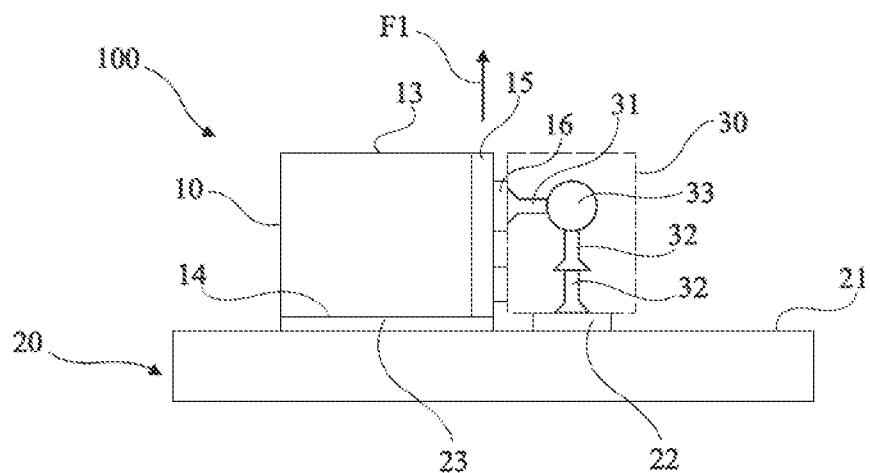
FIG. 2 shows a side view of an embodiment of an electronic device.

FIG. 1 is a side view of an electronic die 10 to which the embodiment described as an example in relation with FIG. 2 may be applied.

Electronic die 10 for example substantially has the shape of a cuboid, and comprises an upper surface 11, a lower surface 12 parallel to upper surface 11, and lateral surfaces 13 and 14 orthogonal to the upper and lower surfaces 11 and 12. In FIG. 1, lateral surface 13 is on the left-hand side of the drawing, and lateral surface 14 is on the right-hand side of the drawing.

Electronic die 10 comprises at its upper surface level a connection area 15 having contacts 16 of die 10 formed thereon. Contacts 16 are shown in relief in FIG. 1, but as a variant, contacts 16 might not protrude from area 15. For example, the contacts 16 may instead may have end surfaces that are flush with the connection area 15 or may be slightly recessed within the connection area 15. A surface at which the contacts 16 are present on the die 13 may be referred to as a contact surface, a connection surface, or some other similar or like type reference to the respective surface of the die 13 at which the contacts 16 are present.

Electronic die 10 is, for example, formed of one or a plurality of electronic components protected by a packaging material giving its shape to die 10. For example, the one or the plurality of electronic components may be within a resin giving shape to the die 10.

A specificity of electronic die 10 is that its lateral surface 13 is its "main" surface. "Main" surface here designates the active surface of the electronic die which should be visibly and/or accessibly placed on assembly of electronic die 10 on a printed circuit board or on a substrate plate. In other words, die 10 should be directed along a direction represented by an arrow F1 parallel to upper surface 15, and having its main surface facing direction F1. According to an example, lateral surface 13 comprises an active area of a sensor, an area of emission of a beam, for example, of a laser beam, a display area, etc. According to at least one embodiment, die 10 is an edge emitting laser die, which emits a laser beam at the level of one or its edge, such as lateral surface 13 in FIG. 1. More particularly, the laser beam is emitted from the superior side of the lateral surface 13, as an example at the level of the arrow representing direction F1.

FIG. 2 is a side view of an embodiment of an electric device 100 comprising the die 10 described in relation with FIG. 1 assembled on a wafer 20.

Wafer 20 is, for example, a printed circuit board (PCB), or a substrate plate, comprising an upper surface 21 having at least one contact 22 formed thereon. Contact 22 is shown in relief in FIG. 2, but as a variant, contact 22 might not protrude from wafer 20. For example, the contact 22 may instead may have end surfaces that are flush with the upper surface 21 of the wafer 20 or may be slightly recessed within the upper surface 21 of the wafer 20.

According to an embodiment, die 10 is assembled on wafer 20 by bonding of the lateral surface 14 of die 10 to the upper surface of wafer 20. Thereby, the surface 13 of die 10 is parallel to surface 21 and is oriented upwards in FIG. 2, as indicated by arrow F1. Further, thereby, the upper surface 11 of die 10 is orthogonal or transverse to the upper surface 21 of wafer 20. An example of a method of manufacturing device 100 is described in further detail in relation with FIG. 3.

Die 10 is electrically coupled to wafer 20 by a connector 30 surrounded and encircled with dotted lines in FIG. 1. More particularly, a contact 16 of die 10 is electrically coupled to a contact 22 of wafer 20 by connector 30. Connector 30 comprises:

one or a stack of a plurality of pillars 31 made of an electrically-conductive material formed on contact 16 and extending along a direction orthogonal or transverse to the upper surface 11 of die 10, in other words parallel to the lateral surface 13 of die 10;

one or a stack of a plurality of pillars 32 made of an electrically-conductive material formed on contact 22 and extending along a direction orthogonal or transverse to the upper surface 21 of wafer 20; and a ball 33 made of an electrically-conductive material in contact with an upper portion of the last pillar 31 and in contact with an upper portion of the last pillar 32.

Pillars 31 and 32 are, for example, metal pillars, which may be, for example, made of copper or of a metal alloy comprising copper. The number of pillars 31 and 32 used to form connector 30 is determined by the placing of contacts 16 and 22 on the respective upper surfaces of die 10 and of wafer 20. Thus, a stack of pillars enables to adjust the height, in the direction of arrow F1, and the width, in the direction orthogonal or transverse to the direction of arrow F1, of connector 30. Here call last pillar 31 or last pillar 32 the pillar 31 or 32 when there is a single pillar 31 or 32, or the last pillar 31 or 32. According to an example, in FIG. 2, a single pillar 31 is shown, and a stack of two pillars 32 is shown. However, it will be readily appreciated that different numbers of pillars may be utilized to form electrical connections depending on the size and shape of the die 10 and the size and shape of the wafer 20, or the positioning of the die 10 relative to the contact 22 of the wafer 20.

Ball 33 enables to electrically connect the last pillar 31 to the last pillar 32. According to an embodiment, ball 33 is a solder ball or soldering paste. Ball 33 is for example made of metal or of a metal alloy, for example, of a metal alloy comprising tin, as an alloy comprising tin, silver, and copper. An advantage of the use of a connector of the type of connector 30 is that such a connector enables to electrically couple electric contacts arranged on surfaces orthogonal to one another. Such a connection cannot be implemented by a wireless solder technique.

Figure 3:
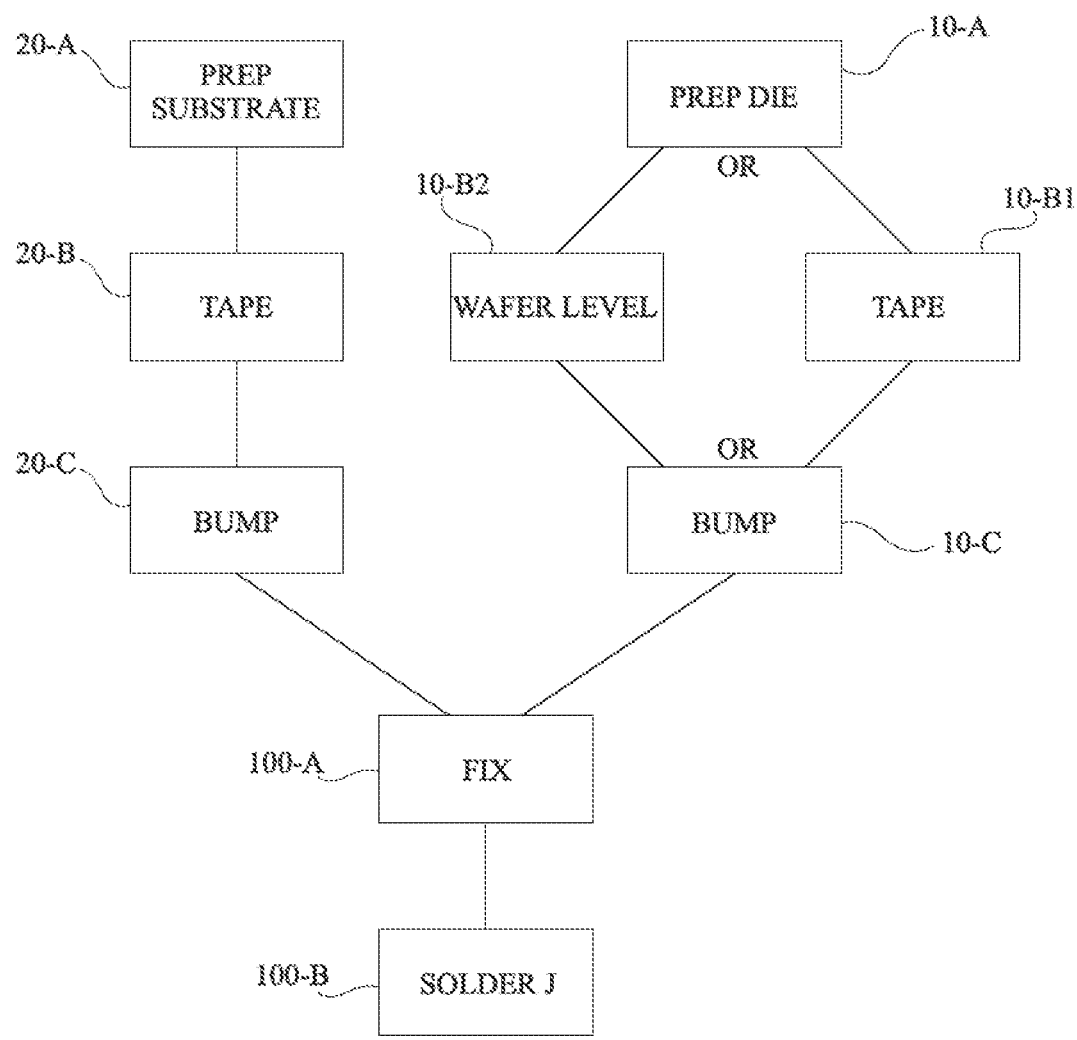
FIG. 3 shows a block diagram illustrating a method of manufacturing the embodiment of FIG. 2.

FIG. 3 is a block diagram illustrating the steps of an implementation mode of a method of manufacturing the device 100 described in relation with FIG. 2.

The manufacturing method comprises three phases, a phase of manufacturing and preparation of die 10, a phase of manufacturing and preparation of wafer 20, and a phase of assembly of die 10 and of wafer 20. The phases of manufacturing and of preparation of die 10 and of wafer 20 may be carried out in parallel, for example, simultaneously or, as a variant, may be carried out one after the other, with no preferred order.

The phase of manufacturing and of preparation of die 10 comprises the following successive steps:

- a step 10-A (PREP DIE) of manufacturing of die 10 during which die 10 and, more particularly, the contacts 16 of die 10, are formed on the upper surface 11 of die 10;
- a step 10-B1 (TAPE) or a step 10-B2 (WAFER LEVEL) of placing of die 10; and
- a step 10-C(BUMP) of forming of pillar(s) 31 on the contacts 16 of die 10.

Step 10-A of manufacturing of die 10 comprises the usual die manufacturing steps and more particularly comprises at least one step of manufacturing of contacts 16.

During steps 10-B1 and 10-B2, die 10 is placed in such a way as to be able to carry out step 10-C. More particularly, during step 10-B1, die 10 is arranged on an adhesive tape band, its upper surface being accessibly positioned, for example, by being directed upwards, as in the position illustrated in FIG. 1. Step 10-B1 may be replaced with step 10-B2 wherein the die has already been individualized, then positioned, for example on an adhesive tape band, being accessibly positioned.

During step 10-C, the pillar(s) 31 are formed on the contacts 16 of die 10. According to an embodiment, each pillar 31 is formed by using a wireless solder technique. More precisely, the tool used to implement the wireless solder technique forms a metal ball and crushes it on contact 16 and breaks the rest of the metal wire to form pillar 31. This operation may be performed several times to form a stack of pillars 31. For example, in some embodiments, the pillars 31 may be stud bumps that are formed one after the other in succession to form a stacked configured.

The phase of manufacturing and of preparation of wafer 20 comprises the following successive steps:
- a step 20-A (PREP SUBSTRATE) of manufacturing of wafer 20 during which wafer 20 and, more particularly, the contacts 22 of wafer 20 are formed on the upper surface 21 of wafer 20;
- a step 20-B (TAPE) of placing of the die; and
- a step 20-C (BUMP) of forming of pillar(s) 32 on the contacts 22 of the wafer.

The step 20-A of manufacturing of wafer 20 comprises usual wafer manufacturing steps and more particularly comprises at least one step of manufacturing of contacts 22.

During step 20-B, wafer 20 is placed in such a way as to be able to carry out step 20-C. More particularly, wafer 20 is for example arranged on an adhesive tape band, its upper surface 21 being accessibly positioned, for example, by being directed upwards, as in the position illustrated in FIG. 2.

During step 20-C, pillars 32 are formed on the contacts 22 of wafer 20. According to an embodiment, pillars 32 are formed by using the same technique as that described in relation with step 10-C, that is, a wireless solder technique. More precisely, the tool used to implement the wireless solder technique forms a metal ball and crushes it on contact 22 and breaks the rest of the metal wire to form pillar 32. This operation may be performed several times to form a stack of pillars 32. For example, in some embodiments, the pillars 32 may be stud bumps that are formed one after the other in succession to form a stacked configured.

The phase of manufacturing of device 100 comprises the following successive steps:
- a step 100-A (FIX) where die 10 is mounted on wafer 20; and
- a step 100-B (SOLDER J) where connector 30 is completed.

During step 100-A, the lateral surface 14 of die 10 is bonded to the upper surface 21 of wafer 20, so that the lateral surface 13 of the die is accessible, as illustrated in FIG. 2. According to an example, the lateral surface 14 is bonded by using a gluing method. For example the lateral surface 14 is bonded or coupled to the surface 21 of the wafer 20 by an adhesive 23, which may be a die attach film (DAF), die attach glue, a die attach adhesive, or some other suitable type of adhesive that may be utilized to bond or couple the lateral surface 14 of the die 10 to the surface 21 of the wafer 20.

During step 100-B, an electrically-conductive ball, for example, a soldering paste ball, is arranged in contact with an upper portion of the last pillar 31 and an upper portion of the last pillar 32 to form ball 33. This operation may be performed by using current solder methods.

Electronic device (100) may be summarized as including a wafer (20) including a first upper surface (21) having at least one first contact (22) arranged thereon; and at least one die (10) including a second upper surface (11) having at least one second contact (16) arranged thereon, and at least one first lateral surface (14) orthogonal to the second upper surface (11), the first lateral surface (14) of said die (10) being bonded to said first upper surface (21) of said wafer (20), said first contact (22) being electrically coupled to said second contact (16) by a connector (30) including one or a stack of a plurality of first electrically-conductive pillars (32) formed on said first contact (22) of said wafer (20); one or a stack of a plurality of second electrically-conductive pillars (31) formed on said second contact (16) of said die (10); and at least one electrically-conductive ball (33) positioned in contact with at least a first upper portion of said first pillar(s) (32) and in contact with at least one second upper portion of said second pillar(s) (31).

Method of manufacturing an electronic device (100) may be summarized as including the following successive steps: a) forming (20-C) one or a stack of first electrically-conductive pillars (32) on a first contact (22) formed on a first upper surface (21) of a wafer (20); b) forming (10-C) one or a stack of second electrically-conductive pillars (31) on a second contact (16) formed on a second upper surface (11) of a die (10); c) (100-A) bonding a first lateral surface (14) of said die (10) to the first upper surface (21) of said wafer (20), said first lateral surface (14) being orthogonal to the second upper surface (11) of said die (10); d) forming and arranging an electrically-conductive ball (33) in contact with a first upper portion of said first pillar(s) (32) and in contact with a second upper portion of said second pillar(s) (31).

Said first pillar(s) (32) may be formed by using a tool adapted to a wireless solder technique.

Said second pillar(s) (31) may be formed by using a tool adapted to the wireless solder technique.

Said first pillar(s) (32) may be made of a metal or of a metal alloy.

Said first pillar(s) (32) may be made of copper or of a metal alloy comprising copper.

Said second pillar(s) (31) may be made of a metal or of a metal alloy.

Said second pillar(s) (31) may be made of copper or of a metal alloy comprising copper.

Said ball (33) may be made of a metal or of a metal alloy.

Said ball (33) may be a soldering paste ball.

The first lateral surface (14) of said die (10) may be bonded to the first upper surface (21) of said wafer (20) by gluing.

Said die (10) may be an edge emitting laser die.

Said wafer (20) may be a substrate.

Said wafer (20) may be a printed circuit board.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. An electronic device comprising:
a wafer including a first surface having at least one first contact; and
at least one die including a second surface having at least one second contact, and at least one lateral surface transverse to the second surface, the lateral surface of the die being bonded to the first surface of the wafer, wherein:
the first contact being electrically coupled to the second contact by a connector, the connector including:
a first number of first electrically-conductive pillars on the first contact of the wafer, at least one first electrically conductive pillar extends outward from the first contact and is transverse to the first surface of the wafer;
a second number of second electrically-conductive pillars on the second contact of the die, at least one second electrically conductive pillar is transverse to the at least one first electrically conductive pillar and the second surface of the at least one die; and
at least one electrically-conductive ball that couples the at least one first pillar to the at least one second pillar.

2. The device according to claim 1, wherein the at least one first pillar is formed by using a tool adapted to a wireless solder technique.

3. The device according to claim 1, wherein the at least one second pillar is formed by using a tool adapted to a wireless solder technique.

4. The device according to claim 1, wherein the at least one first pillar is made of a metal or of a metal alloy.

5. The device according to claim 4, wherein the at least one first pillar is made of copper or of a metal alloy including copper.

6. The device according to claim 1, wherein the at least one second pillar is made of a metal or of a metal alloy.

7. The device according to claim 6, wherein the at least one second pillar is made of copper or of a metal alloy comprising copper.

8. The device according to claim 1, wherein the at least one electrically conductive ball is made of a metal or of a metal alloy.

9. The device according to claim 8, wherein the at least one electrically conductive ball is a soldering paste ball.

10. The device according to claim 1, wherein the lateral surface of the die is bonded to the first surface of the wafer by adhesive.

11. The device according to claim 1, wherein the die is an edge emitting laser die.

12. The device according to claim 1, wherein the wafer is a substrate.

13. The device according to claim 1, wherein the wafer is a printed circuit board.

14. A device, comprising:
a wafer having a first surface and a first contact at and along the first surface;
a die including a second surface coupled to the first surface of the wafer by an adhesive, the die including a third surface transverse to the second surface, and the die including a connection area at the third surface, and the connection area including a second contact, wherein:
the first contact being electrically coupled to the second contact by a connector, the connector including:
a pair of electrically-conductive pillars, the pair of electrically conductive pillars including:
a first electrically-conductive pillar stacked on and coupled to the first contact, the first electrically conductive pillar extending in a first direction transverse to the first surface; and
a second electrically-conductive pillar stacked on and coupled to the first conductive pillar, the second electrically conductive pillar extending in the first direction;
a third electrically-conductive pillar stacked on and coupled to the second contact, the third electrically-conductive pillar extending in a second direction transverse to the first direction; and
an electrically-conductive ball that couples the second electrically-conductive pillar to the third electrically-conductive pillar.

15. The device of claim 14, wherein:
the first direction is parallel with the second surface of the die and orthogonal to the first surface of the wafer; and
the second direction is parallel with the first surface of the wafer and orthogonal to the second surface of the die.

16. The device of claim 14, wherein:
the first electrically conductive pillar, the second electrically conductive pillar, and the third electrically conductive pillar are made of a metal material; and
the electrically-conductive ball is made of a solder material.

17. A device, comprising:
a wafer having:
a first surface;
a first contact at and along the first surface; and
a second contact at and along the first surface and spaced apart from the first contact;
a die including a second surface coupled to the first surface of the wafer by an adhesive, the die including a third surface transverse to the second surface, and the die including a connection area at the third surface, and the connection area including a third contact and a fourth contact spaced apart from the third contact;
a first connector coupling the third contact to the first contact, the first connector including:
one or more first electrically conductive pillars stacked on the third contact, the one or more first electrically conductive pillars are parallel with the first surface and perpendicular with the second surface;
one or more second electrically conductive pillars stacked on the first contact, the one or more second electrically conductive pillars are parallel with the second surface and perpendicular with the first surface; and
a first electrically conductive ball couples the one or more first electrically conductive pillars to the one or more second electrically conductive pillars;
a second connector coupling the fourth contact to the second contact, the second connector including:
one or more third electrically conductive pillars stacked on the fourth contact, the one or more third electrically conductive pillars are parallel with the first surface and perpendicular with the second surface;
one or more fourth electrically conductive pillars stacked on the second contact, the one or more fourth electrically conductive pillars are parallel with the second surface and perpendicular with the first surface; and a second electrically conductive ball couples the one or more third electrically conductive pillars to the one or more fourth electrically conductive pillars.

18. The device of claim 17, wherein:

a respective number of the one or more first electrically conductive pillars is equal to a respective number of the one or more third electrically conductive pillars; and a respective number of the one or more second electrically conductive pillars is equal to a respective number of the one or more fourth electrically conductive pillars.

19. The device of claim 17, wherein a respective number of the one or more first electrically conductive pillars is different from a respective number of the one or more third electrically conductive pillars.

20. The device of claim 17, wherein a respective number of the one or more second electrically conductive pillars is different from a respective number of the one or more fourth electrically conductive pillars.

\* \* \* \* \*